(12) United States Patent
Hiatt

(10) Patent No.: US 7,396,447 B2
(45) Date of Patent: Jul. 8, 2008

(54) THROUGH-HOLE CONDUCTORS FOR SEMICONDUCTOR SUBSTRATES AND SYSTEM FOR MAKING SAME

(75) Inventor: William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 412 days.

(21) Appl. No.: 11/257,215

(22) Filed: Oct. 24, 2005

(65) Prior Publication Data

US 2006/0037864 A1 Feb. 23, 2006

Related U.S. Application Data

(62) Division of application No. 10/784,436, filed on Feb. 23, 2004.

(51) Int. Cl.
*H01L 21/445* (2006.01)

(52) U.S. Cl. .................. 205/123; 205/118; 438/674

(58) Field of Classification Search ............. 205/123, 205/118; 438/674
See application file for complete search history.

(56) References Cited

U.S. PATENT DOCUMENTS

| | | | | |
|---|---|---|---|---|
| 3,158,499 A | * | 11/1964 | Jenkin | .................. 427/600 |
| 3,886,053 A | * | 5/1975 | Leland | .................. 205/93 |
| 4,396,467 A | * | 8/1983 | Anthony | .................. 205/103 |
| 4,547,836 A | | 10/1985 | Anthony | |
| 5,166,097 A | | 11/1992 | Tanielian | |
| 5,487,218 A | | 1/1996 | Bhatt et al. | |
| 6,090,474 A | | 7/2000 | Johansson et al. | |
| 6,190,834 B1 | | 2/2001 | Narahara et al. | |
| 6,221,769 B1 | | 4/2001 | Dhong et al. | |
| 6,410,976 B1 | | 6/2002 | Ahn | |
| 6,458,696 B1 | | 10/2002 | Gross | |
| 6,479,382 B1 | | 11/2002 | Naem | |
| 6,747,465 B2 | | 6/2004 | Esashi et al. | |
| 2002/0057099 A1 | | 5/2002 | Esashi et al. | |
| 2004/0089557 A1 | * | 5/2004 | Tsuchida et al. | .................. 205/291 |
| 2004/0226745 A1 | * | 11/2004 | En | .................. 174/262 |
| 2005/0186791 A1 | * | 8/2005 | Hiatt | .................. 438/667 |
| 2005/0211561 A1 | * | 9/2005 | En | .................. 205/125 |
| 2006/0037864 A1 | * | 2/2006 | Hiatt | .................. 205/123 |
| 2006/0040494 A1 | * | 2/2006 | Hiatt | .................. 438/667 |
| 2007/0190785 A1 | | 8/2007 | Dando | |
| 2008/0035475 A1 | * | 2/2008 | Gebhart et al. | .................. 204/273 |

\* cited by examiner

*Primary Examiner*—Laura M Schillinger
(74) *Attorney, Agent, or Firm*—TraskBritt

(57) ABSTRACT

A method, structure and system for forming a through-hole conductor in a semiconductor substrate includes forming a hole having an inner surface from a first side of the semiconductor substrate to a second side of the semiconductor substrate and plating the inner surface of the semiconductor substrate to form a conductive element when a plating solution is forced from the first side of the semiconductor substrate to the second side of the semiconductor substrate through the hole. The hole is plated in a generally planar plating topology from the first side to the second side of the semiconductor substrate. The through-hole conductor may be formed in a plating system where the semiconductor substrate forms at least a partial partition between a higher pressure bath and a lower pressure bath with the plating solution passing through the hole causing plating within the inner surface of the hole.

4 Claims, 6 Drawing Sheets

THROUGH-HOLE CONDUCTORS FOR SEMICONDUCTOR SUBSTRATES AND SYSTEM FOR MAKING SAME

CROSS-REFERENCE TO RELATED APPLICATION

This application is a divisional of application Ser. No. 10/784,436, filed Feb. 23, 2004, pending.

BACKGROUND OF THE INVENTION

1. Field of the Invention

The present invention relates to forming electrical contacts in a semiconductor substrate. More particularly, the present invention relates to forming electrical conductors through the entire thickness of a semiconductor substrate for electrically coupling opposing sides of the substrate.

2. State of the Art

Integrated circuit devices are typically manufactured as individual circuits which are repeatedly formed in a pattern across the surface of a semiconductor substrate. Because of processing variations and contaminations across the surface of a semiconductor substrate, various ones of the individual integrated circuits will necessarily not function or perform as designed. Rather than identifying the defective ones of the integrated circuits at a much later stage during or after the packaging of individual integrated circuit devices, it is desirable to identify and reject defective devices at as early of a stage as possible and prior to further costly and time-consuming processing and testing.

Wafer-level testing of integrated circuits on a semiconductor substrate is one conventional approach for identifying defective integrated circuits at an early testing stage. Wafer-level testing involves coupling electrical testing probes to an integrated circuit when it is still integral with other ones of integrated circuits on the semiconductor substrate. Because of the fine-pitch or small dimensions associated with the contact or bond pads of each of the integrated circuits, the fabrication and mechanical coupling of the electrically conductive test probes has been both expensive and unreliable. One conventional wafer-level testing approach has been to employ a probe card which includes fine-pitched probes which correspond to the series of integrated circuits located across the semiconductor substrate, which substrate may also be commonly referred to as a "wafer-under-test." The formation of such probe cards is both time consuming and expensive, since each contact probe must be accurately located on the probe card and individually physically populated. Additionally, each integrated circuit contact or bond pad arrangement fabricated on a semiconductor substrate is unique and, under the conventional probe card approach, would require the development of a correspondingly unique probe card for that design.

Accordingly, there has been a need to form a fine-pitched electrically conductive coupling mechanism for coupling with the fine-pitched contact or bond pads of integrated circuits located across a semiconductor substrate. Formation of an intermediary coupling mechanism such as a contactor card for locating between a semiconductor substrate (e.g., a wafer-under-test) and a probe card of a testing system has been attempted. The contactor card by necessity needs to electrically couple signals from its first side to its second or opposing side. While the electrical signals can be routed on either side to a nondirectly opposing arrangement, the signals must be necessarily routed from one side or face through the entire contactor card to a second or opposing face. One conventional approach for electrically coupling a signal from a first side of a wafer-scale contactor card to a second side involved the formation of a physical hole entirely through the thickness dimension of the contactor card. To facilitate electrical conduction through the physical hole, conductive (solder) paste was screened into the hole. Because of the imprecise application process and inconsistency of the conductive paste through the hole, gases and solvents easily become trapped and isolated within the conductive paste-based contact.

While electrical continuity through a gas- or solvent-trapped conductive paste contact is generally adequate at room temperature, wafer-level testing undergoes temperature cycling to further stress marginally functional integrated circuits on the semiconductor substrate. Accordingly, the contactor card also undergoes temperature cycling alongside the wafer-under-test; however, the mismatch of coefficients of thermal expansion (CTE) of the solder paste and silicon of the wafer-scale contactor card as well as the presence of trapped gases and solvents frequently causes a conductive paste-based contact to fracture, which may result in unreliable conductivity with the contact or bond pad of the wafer-under-test. Therefore, there exists a need to form a reliable contact through a wafer-scale semiconductor substrate contactor card that provides an electrically reliable connection and withstands temperature cycling during testing.

BRIEF SUMMARY OF THE INVENTION

The present invention, in several embodiments, is directed to a semiconductor through-hole conductor and method and system for making same.

In one embodiment of the present invention, a method is provided for electrically coupling a first side of a semiconductor substrate to a second side of a semiconductor substrate. The method includes forming a hole having an inner surface from a first side of the semiconductor substrate to a second side of the semiconductor substrate and plating the inner surface of the semiconductor substrate to form a plated hole by forcing a plating solution from the first side of the semiconductor substrate to the second side of the semiconductor substrate through the hole.

In yet another embodiment of the present invention, a method of making a contactor card includes forming a hole, with an inner surface, completely through a semiconductor substrate from a first side to a second side of the semiconductor substrate and forcing a plating solution through the hole from a first plating bath to a second plating bath to deposit conductive material on the inner surface to form a plated through-hole conductor extending from the first side to the second side.

In yet a further embodiment of the present invention, a semiconductor substrate plating system includes a first plating fixture configured to receive a first semiconductor substrate including first and second sides and having at least one hole having an inner surface extending from the first side of the first semiconductor substrate to the second side of the first semiconductor substrate and a plating reservoir configured to receive the first plating fixture with the first semiconductor substrate therein, the first plating fixture and the first semiconductor substrate forming a partition within the plating reservoir between a relatively higher pressure side of plating solution and a lower pressure side of plating solution with the plating solution passing through the at least one hole from the higher pressure bath to the lower pressure bath causing plating within the inner surface of the hole.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
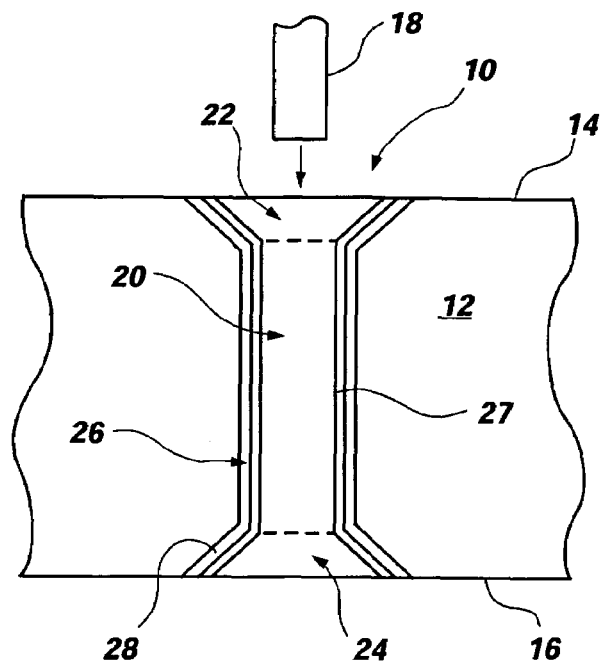
FIG. 1 is a cross-sectional view of a semiconductor substrate having a hole formed therein, in accordance with a process of an embodiment of the present invention for forming a through-hole conductor.

FIG. 1 illustrates a cross-sectional view of a semiconductor wafer or substrate 12, within which it is desirable to form or pass a connection through, from a first side 14 to a second side 16. Substrate 12 may be implemented as a semiconductor substrate such as a silicon wafer and may include varying diameters such as 4 inch, 6 inch, 8 inch and 12 inch or larger wafers. While various sizes of semiconductor wafers are described herein, the various embodiments of the present invention find application in various substrate environments where an electrical connection structure between a first side to a second side thereof is desirable. With regard to typical thicknesses, a typical 4 inch wafer, for example, may have a thickness, for example, of approximately 500 microns while an 8 inch diameter wafer, for example, may include a thickness of approximately 725 microns. Furthermore, the composition of substrate 12 may further include other semiconductive compositions such as gallium arsenide or indium phosphide and may further include nonconductive or insulative compositions, such as glass, as a suitable substrate 12. Furthermore, first and second sides 14 and 16 may further include conductive traces as described below with reference to FIG. 9. Additionally, first and/or second sides 14 and 16 may further include circuits or other functionality which may benefit from the formation of an electrically conductive connection between first side 14 and second side 16 of semiconductor substrate 12.

FIG. 1 further illustrates the formation of a hole 10 which may comprise one or more profiles formed from the removal of substrate material between a first side 14 and a second side 16. Hole 10, for example, may be less than 100 microns in diameter, and 50 micron diameter through-holes have become conventional. It is contemplated that in the near future 30 micron diameter through-holes may be commonplace. Removal of such material may take place through the use of a device 18 which may include a mechanical means, such as a mechanical drill, or an electromagnetic device, such as a laser for ablating substrate material. By way of example and not limitation, device 18 may include a laser, an example of which is a 7 watt, 355 nanometer wavelength laser available from Xsil, Ltd. of Dublin, Ireland. The hole 10 through substrate 12 may be further formed by way of a chemical etching process, such as a plasma etching process. An exemplary etch process for use with the silicon substrate may also include a $SF_6$ or other etching process, the specifics of which are appreciated by those of ordinary skill in the art and are not further described herein. As described above, other substrate compositions may be utilized which would require a corresponding etch process for the formation of hole 10 within substrate 12.

The hole 10 may further include multiple profiles which result from cleaning or other post-machining processes following the drilling or laser ablation process. For example, FIG. 1 illustrates hole 10 as being comprised of a general hole 20 and beveled end profiles 22 and 24 which may result as artifacts from a cleaning process, an example of which is a cleaning process which uses tetramethylammoniahydroxide (TMAH) for preferentially etching the crystalline structure and may cause the beveled contours illustrated as profiles 22 and 24. The formation of hole 10, regardless of any additional profiles, further results in a formation of an inner surface 26 within hole 10 whereupon electrically conductive plating material may be deposited for the formation of the pending through-hole conductor.

Furthermore, substrate 12, in one embodiment, is comprised of a semiconductive material which, if directly coupled to a contact pad of a wafer-under-test having integrated circuits thereon, may present undesirable loading or shorting to the electronic circuitry under test. Therefore, the formation of a conductor between the first and second sides is isolated from substrate 12 through the formation of an insulator material layer 28. In one embodiment of the present invention, insulator material layer 28 is comprised of a TEOS or LSO material deposited within hole 20 to provide a barrier isolation between substrate 12 and a forthcoming formation of a through-hole conductor. Other insulator materials may include silicon dioxide formed from the substrate material and a PARYLENE™ coating, available from Specialty Chemical Coatings. The insulator material layer 28 further provides crosstalk isolation between any other adjacent conductors.

As a further practical process, following the formation of insulator material layer 28 within hole 20, hole 20 may be further coated with a plating-attractive coating for enhancing the plating process. By way of example and not limitation, a coating such as a low temperature titanium nitride (TIN) may be conformally applied within hole 20 which further aids in the activation of the plating process. Furthermore, the embodiments of the present invention may employ electroless plating techniques as well for the formation of conductive plating within hole 20. In an electroless plating process, a seed layer 27 of a conductive material is deposited over the inner surface 26 of the hole 20 and coats the insulator material layer 28. In the illustrated embodiment, the seed layer 27 comprises titanium nitride (TiN) and is deposited by CVD. Other materials that may be used as the seed layer 27 include, without limitation, titanium (Ti), silicon nitride ($Si_3N_4$), a polysilicon, palladium (Pd) and tin (Sn). Other deposition processes that may be used to deposit the seed layer 27 include PVD, vacuum evaporation and sputtering. It will be apparent that the selection of the type of material and deposition process utilized to deposit the seed layer 27 will vary depending on the type of desired material used to form the electrical interconnect through the hole 20.

Figure 2:
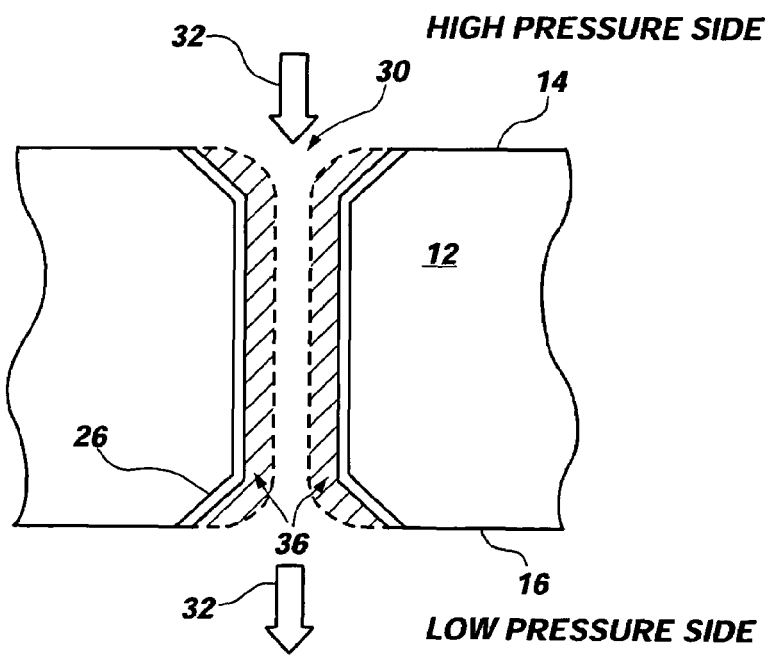
FIG. 2 is a cross-sectional view of a semiconductor substrate having formed therein a through-hole conductor, in accordance with an embodiment of the present invention.

The seed layer 27 is coated with a conductive layer of metal forming conductive plating 36 as illustrated in FIG. 2, according to an electroless deposition process. The conductive plating 36 is deposited on the seed layer 27 of the substrate 12 and may comprise any type of metal including, but not limited to, nickel, cobalt, copper, silver, aluminum, titanium, iridium, gold, tungsten, tantalum, molybdenum, platinum, palladium, nickel-phosphorus (NiP), palladium-phosphorus (Pd—P), cobalt-phosphorus (Co—P), a Co—W—P alloy, other alloys of the foregoing metals and mixtures thereof. The type and thickness of the conductive plating 36 will vary depending on the desired conductivity and use of the interconnect and may be determined, at least in part, by the resistance (R) of the metal or conductive layer expressed by the equation $R=\rho L/A$ as known in the art.

By coating the seed layer 27 with the conductive plating 36 of a suitable metal, an annular conductive path is created through the hole 20 (FIG. 2). The electroless plating process forms a substantially conformal coating in the hole 20 that is substantially free of any voids or keyholes. The conductive layer formed from the electroless plating process will typically have a uniform thickness, a low porosity, will provide corrosion protection and will be relatively hard. The electroless plating process is accomplished by placing the substrate 12 into a bath containing an aqueous solution of the metal to be deposited in ionic form. The aqueous solution also includes a chemical reducing agent such that the metal may be deposited without the use of electrical energy. The driving force for the reduction of the metal ions and subsequent deposition in the electroless plating process is driven by the chemical reducing agent. The reduction reaction is essentially constant at all points on the seed layer 27 so long as the aqueous solution is sufficiently agitated by pressurized flow to ensure that a uniform concentration of metal ions and reducing agents is distributed in the aqueous solution.

FIG. 2 illustrates a through-hole conductor formed in accordance with an embodiment of the present invention. A through-hole conductor 30 is formed between first and second sides 14 and 16 through substrate 12 by forcing the plating solution (not shown) from a high-pressure side of substrate 12 in a flow direction 32 to a low-pressure side thereof. Due to the passage of plating solution in this directed flow process, conductive plating 36 forms on inner surface 26 in a generally uniform manner. Due to the pressurized flow of the plating solution, substantially uniform plating results when fresh plating solution having a generally uniform concentration passes through the physical hole 10 within substrate 12 followed by the periodic cycling of power in the electroplating process. The cycling of the power is timed and sequenced to allow fresh fluid or uniform concentrated fluid to pass into the hole 10 prior to the reactivation of the electroplating power. Electroplating may be preceded by an electroless, or immersion plating process to deposit gold, nickel or other suitable metal layer on the sidewalls of hole 20 to facilitate the electroplating. It is appreciated that at some point in time in such a continuous process, the formation of conductive plating 36 may build up and result in a physical barrier between the high-pressure side and the low-pressure side thereby restricting the flow of plating solution therebetween.

It is appreciated that numerous variables exist in the plating process, including the timing of the application of power for the electroplating process, the concentration and type of plating solution, the duty cycle for application of power in an electroplating process, the pressure and flow rate of plating solution between the high- and low-pressure sides, and the diameter of the hole 10 (FIG. 1) undergoing the plating process. Appropriate values for these parameters may be derived empirically or computationally as appreciated through the practice of the invention as described herein.

Figure 3:
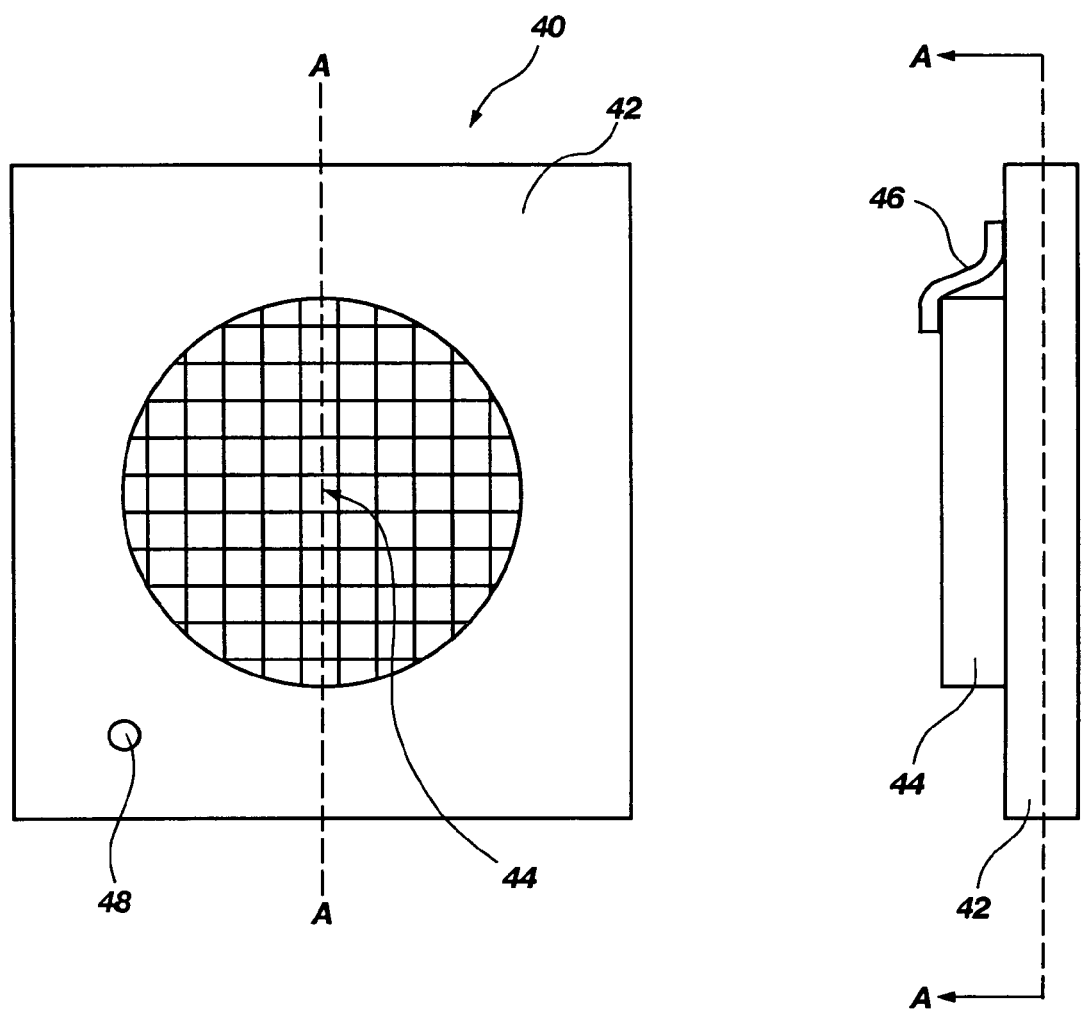
FIG. 3 is a plan and cross-sectional view of a semiconductor substrate and fixture configured for undergoing processes for forming through-hole conductors, in accordance with an embodiment of the present invention.

FIG. 3 illustrates a fixture suitable for retaining a semiconductor wafer or substrate for forming one or more through-hole conductors thereon, in accordance with an embodiment of the present invention. A semiconductor wafer or substrate 44 may have formed therein through-hole conductors as previously described with reference to FIGS. 1 and 2. To maintain a high-pressure and low-pressure differential for the formation of through-hole conductors, a semiconductor wafer 44 having at least one physical hole between the first and second sides is processed in a manner that forces the plating solution through the one or more holes on the semiconductor substrate 44. The flow of the plating solution is controlled by forming high- and low-pressure sides in the plating bath. To isolate the high- and low-pressure sides, a semiconductor wafer or substrate 44 may be arranged in a plating fixture 42 to form a loaded fixture 40 which may thereafter be further loaded into a plating system described with reference to FIGS. 4-6. The loaded fixture 40 constrains and directs the flow of plating solution through the holes 10 (FIG. 1) on substrate 44 between the high-pressure and low-pressure sides of the bath.

The plating fixture 42 further includes a coupling means 46 to facilitate the coupling of semiconductor substrate 44 with plating fixture 42. While a mechanical coupling mechanism comprising a clamp is illustrated, other arrangements may include a vacuum coupling mechanism, an adhesive-based mechanism or other similar attachment for attaching a cooperative barrier mechanism to the semiconductor substrate 44. Furthermore, utilization of a plating fixture 42 is illustrated as but one technique for forming a boundary between high-and low-pressure sides within a plating system. Also contemplated within the scope of the present invention is the formation of a barrier between high- and low-pressure sides by way of the semiconductor substrate itself without the use of a fixturing mechanism. Furthermore, coupling means 46 may provide electrical coupling to a substrate 12 for facilitating an electroplating process. Also contemplated are flow bypass mechanisms 48 which may facilitate the circulation of higher concentration plating solutions to staged substrates in sequence in a multisubstrate arrangement without requiring the solution to first pass through an "upstream" semiconductor wafer or substrate 44.

Figure 4:
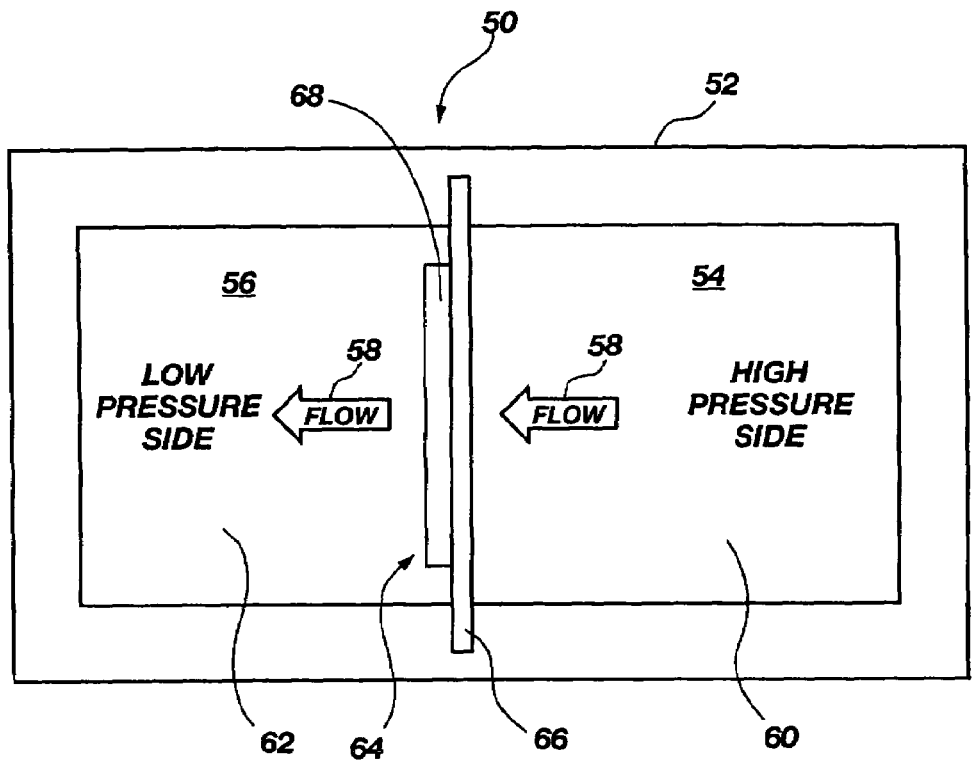
FIG. 4 illustrates a plating system configured for forming through-hole conductors on a single semiconductor substrate, in accordance with an embodiment of the present invention.

FIG. 4 illustrates a single wafer plating system for forming through-hole conductors, in accordance with an embodiment of the present invention. A single wafer plating system 50 includes a plating tank 52 configured for placing therein a semiconductor wafer 68 which, in one embodiment, may be loaded into a plating fixture 66 to form a loaded fixture 64. As shown, loaded fixture 64 may be simply retained across the width of the plating tank 52 by retention slots or other fixturing. As described above, a barrier is formed between a high-pressure side 54 and a low-pressure side 56 of tank 52 which induces a flow direction 58 of a plating solution from a high-pressure bath 60 to a low-pressure bath 62. By way of example and not limitation, plating solutions within the respective baths may include copper sulphate or nickel sulphate if the conductive plating 36 (FIG. 2) is copper or nickel, respectively. Other plating chemistries, as appreciated by those of ordinary skill in the art, may also be employed to plate other metals such as, for example, silver and gold.

Figure 5:
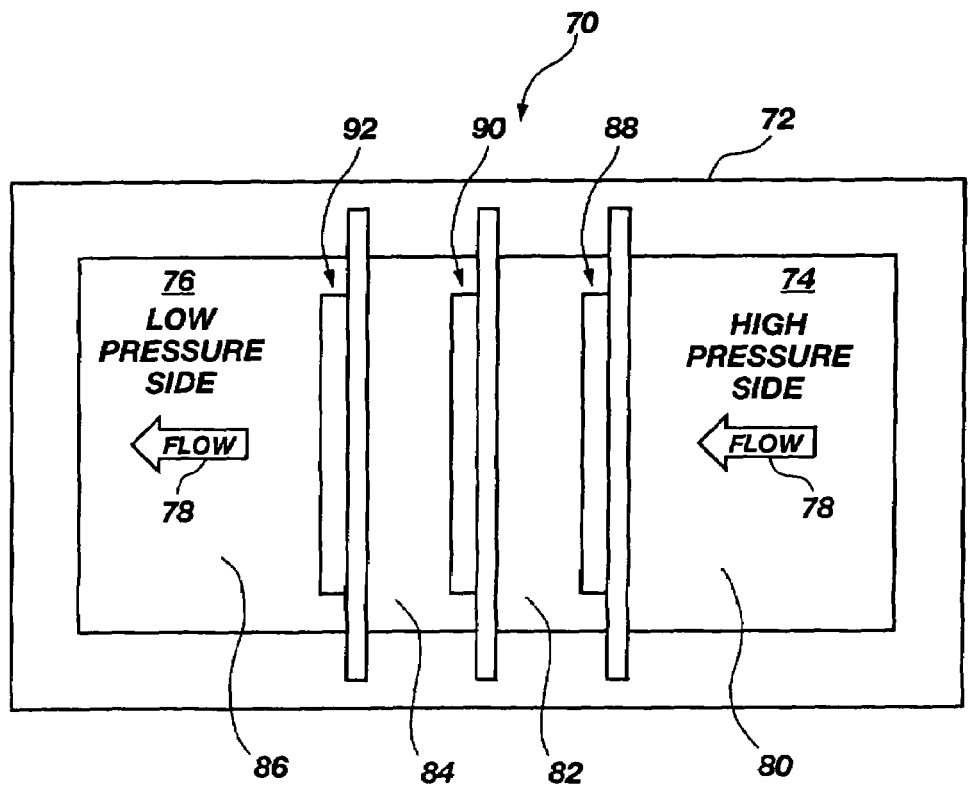
FIG. 5 illustrates a substrate plating system for forming through-hole conductors on a plurality of semiconductor substrates, in accordance with an embodiment of the present invention.

FIG. 5 illustrates a multiple wafer plating system, in accordance with another embodiment of the present invention. A multiple wafer plating system 70 includes a plating tank 72 which may include one or more loaded fixtures 88-92 having opposing ends disposed in slots for forming barriers between high-pressure side 74 and low-pressure side 76 which induces the flow of a plating solution in a direction 78 through the respective plating solution baths 80-86. It should be appreciated that in such a staggered bath arrangement, plating solution concentrations within the respective baths may vary due to metal concentration depletion of the solution occurring during the plating process at a previous upstream stage. Control of the concentration variations of the plating solutions may be addressed through controlling the duty cycles of the electroplating process of subsequent stages or by allowing fresh solution to pass through each of the subsequent stages prior to the activation of the electroplating power at each of the substrates within system 70.

While plating solutions, being liquid in nature, are essentially incompressible, flow direction 78 is maintained by pressurizing the plating solution in bath 80. Furthermore, as the through-hole conductors 30 (FIG. 2) on loaded fixtures 88-92 become plated through, flow of the plating solution to the next successive bath becomes more restricted. Therefore, it may be desirable in a multiple wafer plating system 70 to include flow bypass mechanisms 48 (FIG. 3) on at least "upstream" loaded fixtures in order to facilitate flow of the plating solution to subsequent baths.

Figure 6:
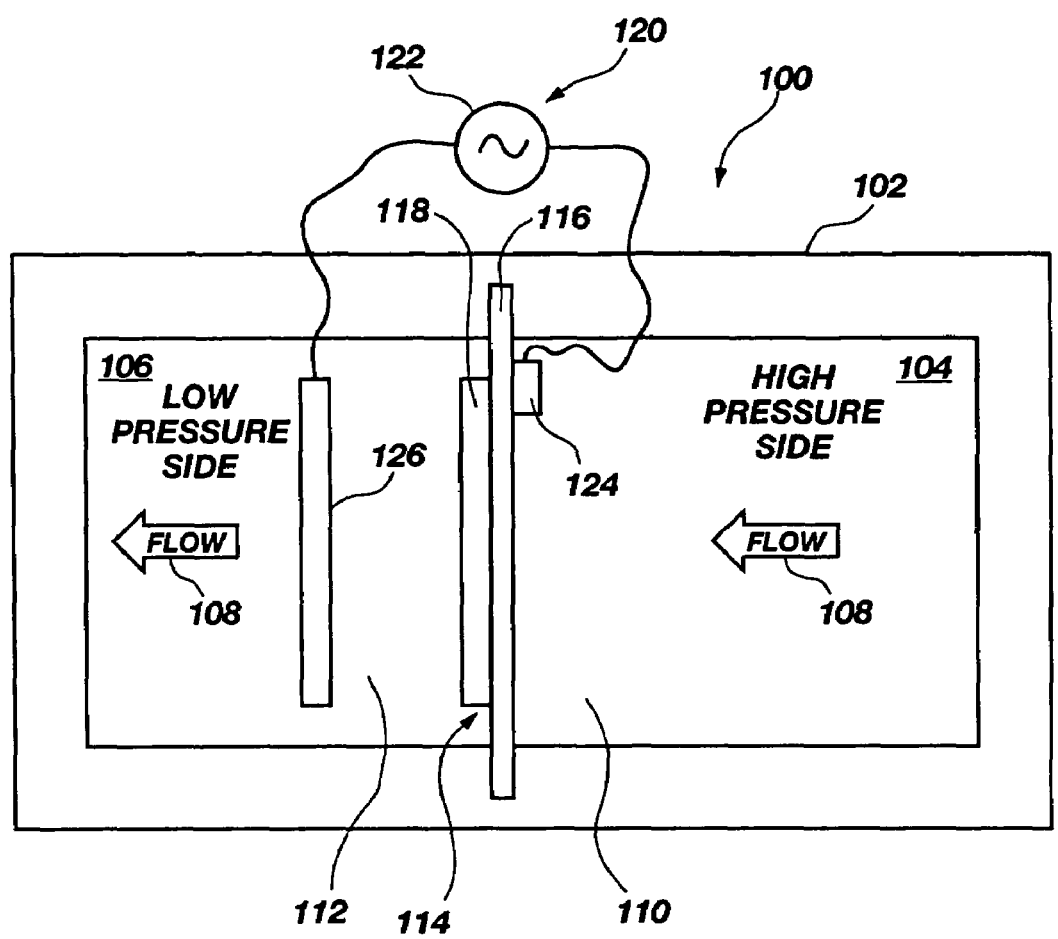
FIG. 6 illustrates a plating system configured as an electroplating arrangement for forming through-hole conductors, in accordance with an embodiment of the present invention.

FIG. 6 illustrates a wafer electroplating system 100, in accordance with an embodiment of the present invention. An electroplating system 100 includes a plating tank 102 with one or more loaded fixtures 114, each including a semiconductor wafer or substrate 118 and a plating fixture 116. Electroplating system 100 is electrically configured with an electroplating power arrangement 120 comprised of a signal generator 122 for executing a specific electrical activation duty cycle as exhibited between electrodes 124 and 126. The electrode 124 may comprise a cathode operably coupled to a semiconductor wafer or substrate and an electrode 126 such as an anode. The plating solution flow direction 108 is maintained between a high-pressure side 104 with a bath 110 to a low-pressure side 106 with a bath 112, each comprised of a plating solution. The electroplating configuration may be further extended to a multiwafer arrangement as illustrated in FIG. 5.

With the plating tanks of the present invention, relative high pressure and low pressure baths may be implemented by using sealed plating tanks and pressurizing one side thereof or increasing the head of the plating solution through the use of a pump. Alternatively, the plating tanks may dispose substrates in a vertical stack and utilize gravity for providing the pressure differential while using a pump to remove or recirculate plating solution from the bottom of the tank back to the top.

Figure 7:
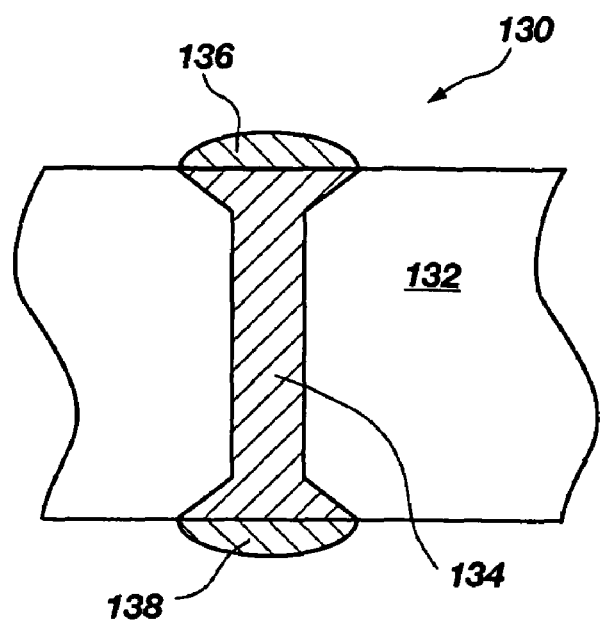
FIG. 7 is a cross-sectional view of a through-hole conductor, in accordance with an embodiment of the present invention.

FIG. 7 illustrates a cross-sectional view of a through-hole conductor formed in accordance with an embodiment of the present invention. The through-hole conductor and related processes described herein may further incorporate additional profiles which may further provide beneficial features. As illustrated, a through-hole conductor 130 including a conductive element 134 provides electrical conductivity through a semiconductor substrate 132 and may be electrically isolated from the semiconductor substrate 132 by an insulator material layer (not shown), an example of which is described above as TEOS. Extended coupling profiles for physically coupling to an electrical connection through the semiconductor substrate 132 may be further accommodated by the addition of one or more conductive caps 136, 138 which extend the profile of the through-hole conductor 130 above the corresponding surface of the semiconductor substrate 132. Conductive caps 136, 138 may be formed on the ends of conductive element 134 by electroplating as known to those of ordinary skill in the art and are, therefore, not further described herein. Furthermore, a nickel/gold cap is also suitable for use as a contact.

Figure 8:
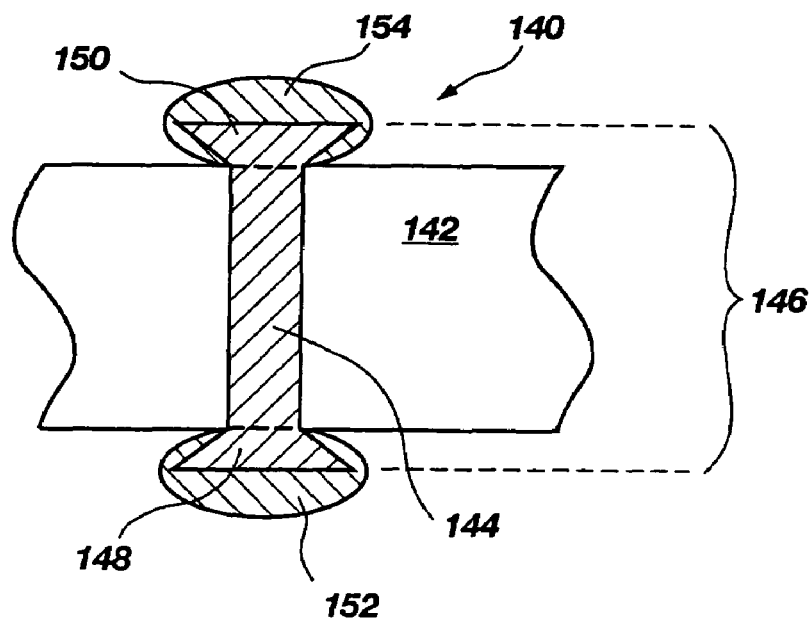
FIG. 8 is a cross-sectional view of a through-hole conductor, formed in accordance with another embodiment of the present invention.

FIG. 8 illustrates a cross-sectional view of a through-hole conductor, in accordance with another embodiment of the present invention. A through-hole conductor 140 includes a conductive element 144 for electrically coupling first and second sides of a semiconductor substrate 142. In the present embodiment, electrical contact with conductive element 144 is further pronounced by etching one or more sides of the semiconductor substrate 142 from an original thickness or dimension 146 to further expose one or more conductor profiles 148, 150 for additional formation of one or more conductive caps 152, 154 to extend the exposure of the conductive element 144 and to lock the structure of conductor 140 within semiconductor substrate 142. By way of example, one suitable cap material is nickel, which may be electroplated.

Figure 9:
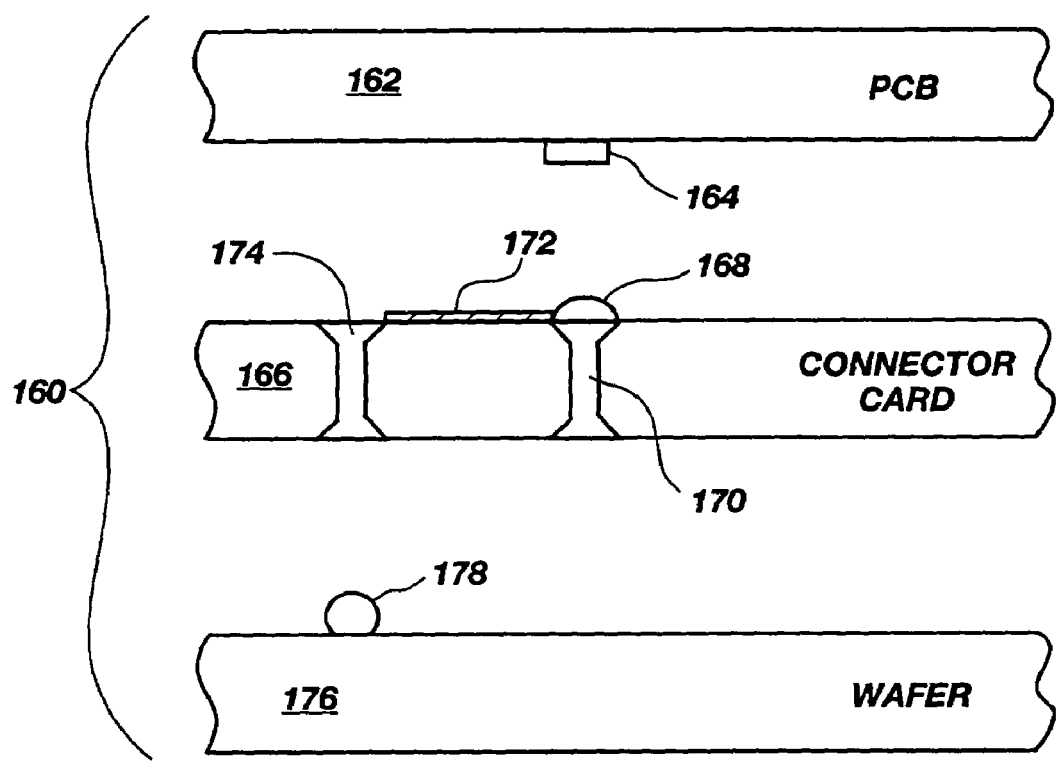
FIG. 9 illustrates an interconnection system utilizing through-hole conductors described herein, wherein the interconnection system is illustrated as being arranged in accordance with an embodiment of the present invention.

FIG. 9 illustrates incorporation of a through-hole conductor into a connector card and further into an interconnection system 160, in accordance with embodiments of the present invention. A connector card 166 functions as an intermediary coupling means for conducting one or more electrical contacts (e.g., contact pads) between two separate conductive interfaces, an example of which is shown as a printed circuit board (hereinafter "PCB") 162 and a wafer or other semiconductor substrate 176 bearing a plurality of integrated circuits. FIG. 9 illustrates, by way of example and not limitation, a pad 164 on PCB 162 coupling with a conductive cap 168 on through-hole conductor 170. Similarly, a conductive cap 178 on a wafer or substrate 176 couples to a through-hole conductor 174 which, in turn, couples to the through-hole conductor 170 via a conductive trace 172. Interconnection system 160 may be a portion of a testing system with wafer or substrate 176 being a wafer-under-test and PCB 162 being a portion of a testing system such as a probe card from a tester.

While a plated through-hole conductor for application in a substrate such as a semiconductor wafer has been described and illustrated, other variations are also contemplated within the scope of the present invention. Specifically, one or more profiles of the hole within which the plating is applied has been described, however, any variation of the profile which facilitates the plating of a conductive interconnect between a first and second side of the semiconductor wafer is further contemplated as an equivalent. Furthermore, the thickness of the conductive plating may vary from a small thickness adequate for providing electrical continuity from the first side to the second side of the semiconductor wafer to a solidly plated through-hole conductor between the first and second sides. Additionally, layering of various plating materials for forming a through-hole conductor is also contemplated.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. A semiconductor substrate plating system, comprising:
a first plating fixture configured to receive a first semiconductor substrate including first and second sides and having at least one hole having an inner surface from the first side of the first semiconductor substrate to the second side of the first semiconductor substrate; and
a plating tank configured to receive the first plating fixture with the first semiconductor substrate therein, the first plating fixture and the first semiconductor substrate forming a partition within the plating tank of a higher pressure side with a higher pressure bath and a lower pressure side with a lower pressure bath with plating solution passing through the at least one hole from the higher pressure bath to the lower pressure bath and plating the inner surface of the at least one hole.

2. The semiconductor substrate plating system of claim 1, further comprising:
a second plating fixture configured to receive a second semiconductor substrate including first and second sides and having at least one hole having an inner surface from the first side of the second semiconductor substrate to the second side of the second semiconductor substrate; and
the plating tank further configured to receive the second plating fixture with the second semiconductor substrate therein, the second plating fixture and the second semiconductor substrate forming a partition within the plating tank of the lower pressure side with the lower pressure bath and a yet lower pressure side with a yet lower pressure bath with plating solution passing through the at least one hole from the lower pressure bath to the yet lower pressure bath and plating the inner surface of the at least one hole.

3. The semiconductor substrate plating system of claim 1, further comprising an electroplating arrangement configured within the plating tank and further configured to induce an electric field between the inner surface of the at least one hole of the first semiconductor substrate and the plating solution within the plating tank.

4. The semiconductor substrate plating system of claim 1, wherein the first plating fixture further has formed therein a bypass mechanism for passing the plating solution from the higher pressure bath to the lower pressure bath.

* * * * *